United States Patent [19]

Cmiel et al.

[11] Patent Number: 5,639,076
[45] Date of Patent: Jun. 17, 1997

[54] LIGHTED INFLATABLE DEVICE WITH LONG BATTERY LIFE

[75] Inventors: Peter J. Cmiel, Minneapolis; Kerry D. Mullen, Shorewood; Eric Axelson, Minnetonka, all of Minn.

[73] Assignee: Counter Punch Group, Edina, Minn.

[21] Appl. No.: 582,456

[22] Filed: Jan. 3, 1996

[51] Int. Cl.$^6$ .................................................. A63B 43/06
[52] U.S. Cl. ................. 473/570; 362/806; 446/220; 446/485
[58] Field of Search .................. 273/58 G; 362/103, 362/806; 446/219, 220, 485

[56] References Cited

U.S. PATENT DOCUMENTS

| | | | |
|---|---|---|---|
| 1,832,408 | 11/1931 | Modes | 362/806 X |
| 2,838,872 | 6/1958 | Beck | 46/87 |
| 2,849,819 | 9/1958 | Murphy et al. | 46/230 |
| 3,058,261 | 10/1962 | Lakin | 46/99 |
| 3,458,205 | 7/1969 | Smith et al. | 273/58 G X |
| 3,521,886 | 7/1970 | Bosco | 273/138 |
| 4,179,832 | 12/1979 | Lemelson | 40/540 |
| 4,282,680 | 8/1981 | Zaruba | 46/227 |
| 4,292,999 | 10/1981 | Szollmann | 137/560 |
| 4,335,538 | 6/1982 | Greenberg | 46/88 |
| 4,776,589 | 10/1988 | Yang | 273/58 |
| 4,930,776 | 6/1990 | Newcomb et al. | 273/58 G X |
| 5,054,778 | 10/1991 | Maleyko | 273/58 |
| 5,066,012 | 11/1991 | Stark | 273/65 |
| 5,075,830 | 12/1991 | Perez | 362/806 X |
| 5,228,686 | 7/1993 | Maleyko | 273/58 |

OTHER PUBLICATIONS

LMC6574 Quad/LMC6572 Dual Low Voltage (2.7V and 3V) Operational Amplifier, *National Semiconductor*, Nov. 1993.

*Primary Examiner*—William H. Grieb
*Attorney, Agent, or Firm*—Palmatier, Sjoquist, Helget & Voigt, P.A.

[57] ABSTRACT

A permanently sealed, lighted, inflatable device comprises a permanently sealed outer shell, an inner inflatable bladder disposed within the outer shell, a valve for inflating the inner inflatable bladder, and a self-contained, non-replaceable illumination element disposed between and engagingly held in place by the inner inflatable translucent bladder and the outer translucent shell. The illumination element includes a control element for conserving battery life. The bladder and shell have translucent portions through which light from the illumination element passes.

29 Claims, 2 Drawing Sheets

5,639,076

LIGHTED INFLATABLE DEVICE WITH LONG BATTERY LIFE

BACKGROUND OF THE INVENTION

In the past, it has been proposed to provide amusement balls with interior lights for various purposes. Such past devices, however, leave much to be desired in respect to the amusement function, durability and long life.

A major problem with such past devices is that the illumination element is not self-contained and must be replaced periodically by opening the device. This requires some sort of openable closure which may allow dirt, water, and moisture into the device, which may cause the battery to short out. The presence of such a closure also affects the play characteristics of the device, for example by causing the device to bounce irregularly.

Another problem with such past devices is that the internal illumination element is heavy and is generally placed within a hollow core at the center of the device. In such a position, the illumination element may move around and may affect the balance of the device. This may lead to undesirable play characteristics. For example, if the device is a regulation-size basketball, past devices would not have the weight and balance of a standard basketball.

In some past devices, the illumination element was placed in a membrane structure within the inflatable wall of the device, with wires leading through the membrane structure to lights outside the membrane structure. Such devices had to be carefully designed so that air did not leak out of the device because of the penetration of the membrane structure by the wires.

Another problem with such past devices is that an external switch was necessary to turn on the illumination element. The presence of the external switch produced another possible entry point for dirt, water, and moisture and another potential disturbance of the device's play characteristics.

Still another problem with such past devices was that the battery life of the illumination element was very short, because the illumination element was turned on all of the time that the switch was closed. Therefore, the battery had to be frequently replaced.

There is a need for a permanently sealed, lighted inflatable device with a self-contained, non-replaceable illumination element for use as a sports ball in low light conditions. The device should also be usable as an inflatable device in water sports and in water safety.

SUMMARY OF THE INVENTION

A permanently sealed, lighted, inflatable device comprises a permanently sealed outer shell, an inner inflatable bladder disposed within the outer shell, a valve for inflating the inner inflatable bladder, and a self-contained, non-replaceable illumination element disposed between and engagingly held in place by the inner inflatable translucent bladder and the outer translucent shell. The illumination element includes a control element for conserving battery life. The bladder and shell have translucent portions through which light from the illumination element passes.

A principal object and advantage of the present invention is that it is permanently sealed to prevent the entry of dirt, water, and moisture which might affect the operation of the illumination element.

A second object and advantage of the present invention is that there is no closure which might interfere with the play characteristics of the device.

Another object and advantage of the present invention is that the illumination element is engagingly held in place between an inflatable bladder and an external shell, eliminating any motion of the illumination element which might affect the balance or play characteristics of the device.

Another object and advantage of the present invention is that an external switch is not required to turn on the illumination element. This eliminates another source of dirt, water, and moisture and another potential disturbance to the play characteristics of the device.

Another object and advantage of the present invention is that it includes an electronic control element for conserving battery life, leading to very long battery life and the ability to make the illumination element self-contained and non-replaceable.

A feature of the present invention is that both the outer shell and the inner inflatable bladder are at least partially translucent, allowing light to pass in all directions from the illumination element through the device.

Another feature of the present invention is the use of low-power light emitting diodes (LEDs) in the illumination element.

Another feature of the present invention is a vibration-sensitive switch which responds to motion of the device to turn on the illumination element for a fixed period.

Another feature of the device is a novel electronic circuit for pulsing current to the LEDs to conserve battery life.

Another feature of the device is a novel, resistance-based current limiting circuit to conserve battery life.

Another feature of the device is that the battery may be rechargeable and the device may include a recharger.

While not limiting, a list of devices which may be built using the present invention includes sports balls such as volleyballs, tetherball, footballs, soccer balls, and playground balls of all sizes; bicycle tires; inflatable pool toys; moon shoes; BounceBlasters; inflatable trampolines; inflatable slides; inflatable boats; inflatable swim vests; inflatable pools; and inflatable air mattresses. The invention is generally adaptable to be used in any sealed, inflatable device.

DETAILED DESCRIPTION OF THE PREFERRED EMBODIMENTS

Figure 1:
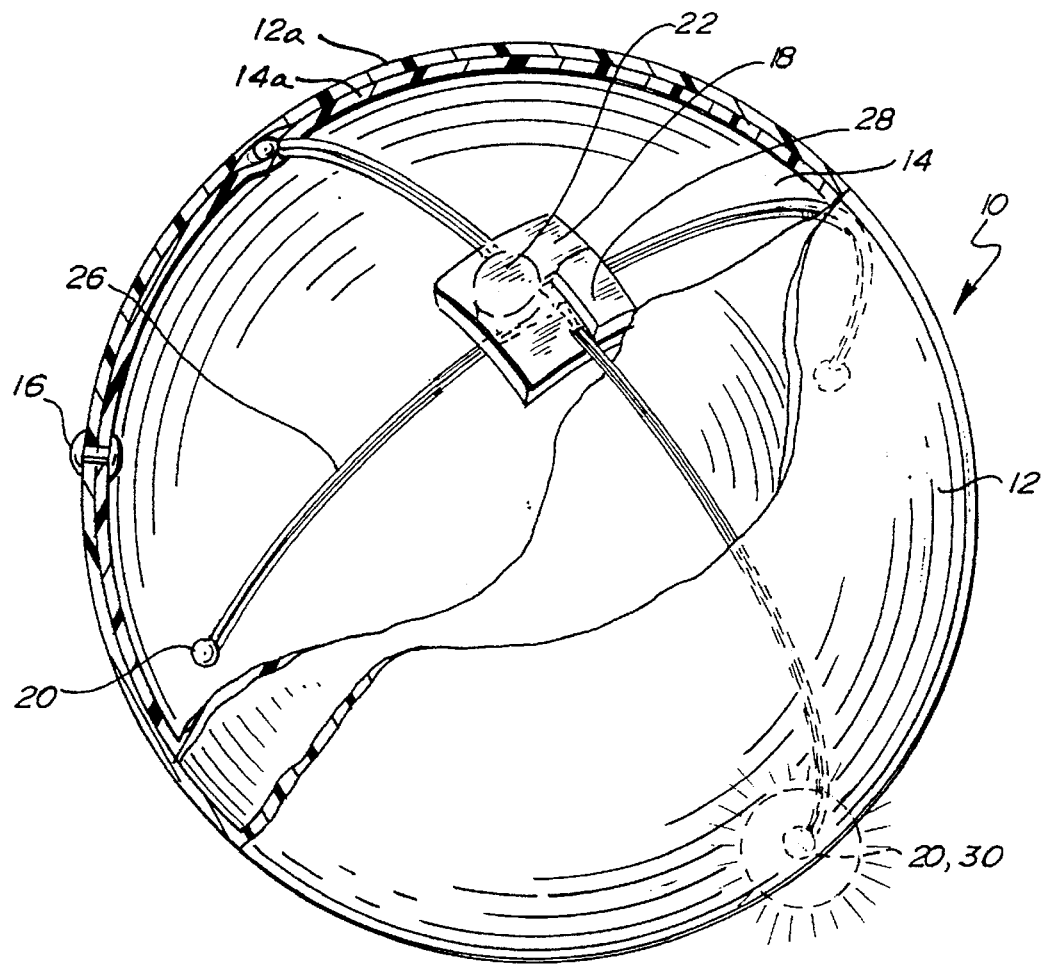
FIG. 1 is a perspective view of one embodiment of the lighted, inflatable device of the present invention, with some structure broken away to show internal structure.

FIG. 1 is a perspective view of an embodiment of the lighted, inflatable device 10 of the present invention.

The lighted, inflatable device 10 includes a permanently sealed outer shell 12 of some suitable material such as rubber or plastic. The shell 12 has a translucent portion 12a.

An inner, inflatable bladder 14 is disposed within the outer shell 12. The bladder is made of some suitable material such as rubber or plastic. The bladder 14 has a translucent portion 14a.

The inner, inflatable bladder 14 is inflated by a means for inflating 16, which preferably is a standard one-way valve 16 such as may be used in basketballs and footballs.

An illumination element 18 is disposed between and securely held between the inner inflatable bladder 14 and the outer shell 12. The illumination element 18 is preferably engagingly held in place by the outer shell 12 and the inner inflatable bladder 14.

The illumination element 18 is preferably self-contained and non-replaceable.

From the above, it will be seen that the device 10 is permanently sealed, eliminating the possibility of dirt, moisture or water entering the device 10 and affecting the operation of the illumination element 18. It will also be seen that because the device 10 is permanently sealed and the illumination element 18 is self-contained and non-replaceable, there is no need for any external closure to access the illumination element. This further eliminates any possibility of dirt, water or moisture entering the device 10. The absence of a closure also eliminates any interference with the play characteristics of the device which might be caused by the closure, such as irregular bouncing when the closure contacts the ground.

It is also apparent that the illumination element 18 is engagingly held in place between the shell 12 and the bladder 14. This eliminates any motion of the illumination element which might affect the balance or the play characteristics of the device 10.

The device 10 may preferably be totally translucent, allowing light from the illumination element to pass in all directions through the device.

The illumination element 18 further comprises a light 20, battery 22, switch 24, wiring 26, and a control element 28 connected between the switch 24 and the light 20. The control element 28 controls when the light is turned on, thereby prolonging battery 22 life.

Preferably, the light 20 is one or more light-emitting diodes 30. However, the light 20 might alternatively be electroluminescent or fluorescent.

The switch 24 is preferably inaccessible from the outside of the device 10. Accordingly, the switch 24 is engaged and disengaged by some stimulus which does not require external access. Preferably, the switch 24 is vibration-sensitive, for example a reed switch or a piezo film vibration sensor such as is available from AMP, Inc., Harrisburg, Pa. Alternatively, the switch 24 may be pressure-sensitive, motion-sensitive, light-sensitive, or temperature-sensitive.

The control element 28 is preferably electronic in order to minimize weight and prolong battery life. In one embodiment, the control element 28 comprises a novel pulsing circuit 32 which turns the light-emitting diode 30 on and off while the switch 24 is on. Preferably, the pulsing circuit 32 turns the light-emitting diode 30 on for 0.1 millisecond and off for 39.9 millisecond, thereby pulsing the light-emitting diode at 25 times per second. At such a pulsation rate, the light-emitting diode 30 appears to be on all the time, yet battery 22 life is prolonged.

Table 1 is a power analysis of the power requirements of the novel pulsing circuit 32, showing the total lifetime for the non-replaceable illumination element 18 and the battery life requirements needed to achieve various total lifetimes. As can be seen, very long total lifetime may be achieved with modest battery requirements.

TABLE I

| Total Time | Time On (Hours) | Time Off (Hours) | Power On (Ma) | Power Off (Ma) | Battery Life Requirement (Ma-Hours) |
|---|---|---|---|---|---|
| 100 | 8.3 | 91.7 | 16.7 | 0.0 | 17 |
| 200 | 16.7 | 183.3 | 33.3 | 0.0 | 33 |
| 300 | 25.0 | 275.0 | 50.0 | 0.0 | 50 |
| 400 | 33.3 | 366.7 | 66.7 | 0.0 | 67 |
| 500 | 41.7 | 458.3 | 83.3 | 0.0 | 83 |
| 600 | 50.0 | 550.0 | 100.0 | 0.0 | 100 |
| 700 | 58.3 | 641.7 | 116.7 | 0.0 | 117 |
| 800 | 66.7 | 733.3 | 133.3 | 0.0 | 133 |
| 900 | 75.0 | 825.0 | 150.0 | 0.0 | 150 |
| 1000 | 83.3 | 916.7 | 166.7 | 0.0 | 167 |
| 8760 | 730.0 | 8030.0 | 1460.0 | 0.0 | 1460 |

The control element 28 may alternatively be a novel resistance-based, current-limiting circuit 34 which turns on the light-emitting diode 30 when the switch 24 is on. Design goals for the current-limiting circuit total lifetime and battery life requirements are similar to those of the pulsing circuit 30.

Figure 2:
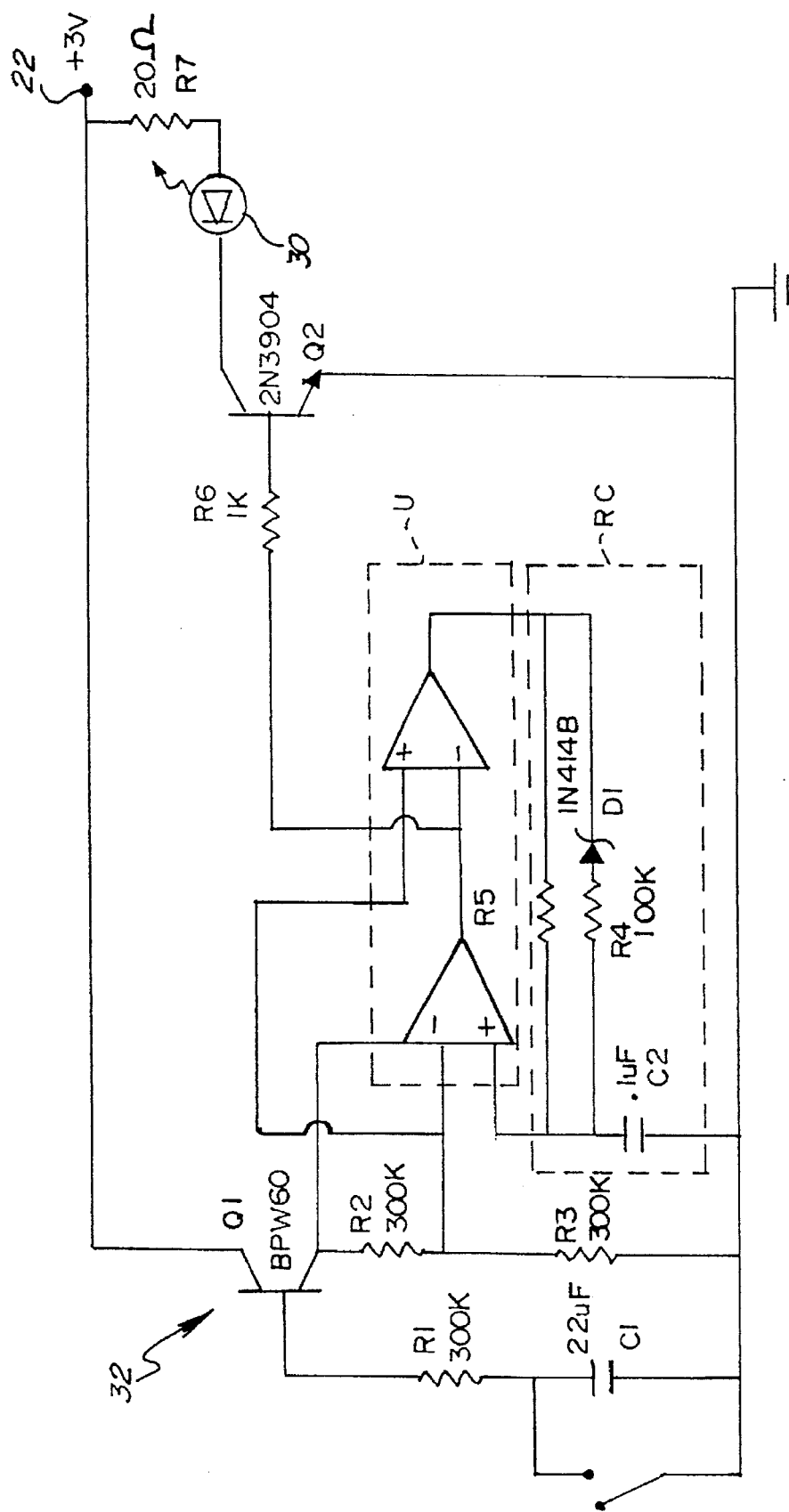
FIG. 2 is a circuit schematic of a novel, pulsing circuit for the illumination element of the present invention.

FIG. 2 is a circuit schematic for the pulsing circuit 32. The pulsing circuit 32 includes a first transistor $Q_1$ connected to the battery 22. A first capacitor $C_1$ is connected to the first transistor $Q_1$. The first capacitor $C_1$ turns on the first transistor $Q_1$ when discharged and turns off the first transistor $Q_1$ when charged. The first capacitor $C_1$ is discharged in a period $t_1$ by closing the switch 22. The first capacitor $C_1$ is recharged by current flow through the first transistor $Q_1$.

The pulsing circuit 32 also includes a two-stage operational amplifier U, having a first stage $u_1$ and second stage $u_2$. The inverting input of the first stage $u_1$ is connected to the first transistor $Q_1$, preferably at the collector of $Q_1$. The output voltage of the second stage $u_2$ is the opposite of the output voltage of the first stage $u_1$. A suitable device is the LMC6572 Dual Low Voltage Operational Amplifier from National Semiconductor.

A second transistor $Q_2$ is connected to the output of the first stage $u_1$ of the operational amplifier U, to ground (GND) and to the light-emitting diode 30 (D2).

An RC circuit is connected between the output of the second stage $u_2$ of the operational amplifier U and the non-inverting input of the first stage $u_1$ of the operational amplifier U.

As more particularly described below, the pulsing circuit 32 will thus pulse the light-emitting diode 30 on for a period $t_2$ and off for a time period $t_3$. The values of $t_1$, $t_2$, and $t_3$ are determined as well known in the art by the values of the resistors and capacitors.

Circuit Explanation for the Pulsing Circuit

This circuit is intended to be fully off and drawing no current until it is jarred, whereupon it will be activated and drive an LED with high current pulses. The circuit draws little overhead current and the average current draw, including the LED, is low. While vibrations continue, the circuit remains in operation driving the LED. When vibrations cease, the circuit turns itself off after a brief interval. Please refer to FIG. 2.

$Sw_1$ is some form of switch, which when vibrated, will make a temporary low impedance path to ground. $Sw_1$, $C_1$, $R_1$, and $Q_1$ comprise the on/off section of the circuit. Vibration of $SW_1$ creates a low impedance path between the anode of $C_1$ and ground, rapidly discharging $C_1$. Current then flows from the emitter of $Q_1$ through the base, through $R_1$. This current flow turns $Q_1$ on. When in the on state, $Q_1$ acts as a source of current to power up the remainder of the circuit. As current flows from the base of $Q_1$ through $R_1$, it charges $C_1$ back up to +3 volts. As the voltage at the base of $Q_1$ approaches 3 volts, it shuts $Q_1$ off. If $Sw_1$ is vibrated again before $C_1$ charges back up to 3 volts, it will again fully discharge $C_1$, ensuring that $Q_1$ remains on. The on-time period $t_1$ for the turn-on circuit elements is set primarily by the values of $R_1$ and $C_1$. Lowering the value of either or both will reduce the charge-up time of $C_1$ and hence reduce the on-time period $t_1$.

When $Q_1$ is in the on state, 3 volts are supplied to $U_1$, which is a CMOS dual low power single supply rail to rail Op Amp. Amplifier 1 is configured as a comparator rather than in a conventional OP amp configuration. $R_2$ and $R_3$ set up the reference voltage for this comparator, essentially splitting the voltage between the battery+level and ground. The reference is thus typically 1.5 volts. This reference is fed into the inverting (−) input of the Op amp. The non-inverting input (+) connects to $C_2$, $R_4$ and $R_5$. The non-inverting input is the point where an active signal is fed into this amplifier. $C_2$, $R_4$ and $R_5$ act as an RC timing network. In its initial state, $C_2$ is discharged and the voltage at the+input is low, near ground. This output is fed into the inverting (−) input of amplifier 2. The same 1.5 volt reference from $R_2$ and $R_3$ is fed into the non-inverting+input of amplifier 2. The low voltage at the−input of amplifier 2 causes the inverted voltage to appear at the output; hence the output of amplifier 2 is high. The output voltage of amplifier 2 will always be the opposite of the output voltage of amplifier 1. The high output voltage of amp 2 provides current through $R_5$ which begins to charge up $C_2$. $D_1$ remains reverse biased at this point and $R_4$ does not contribute the charge up of $C_2$. After a time period, $t_3$, the voltage of $C_2$, exceeds the 1.5 volt reference and the output of amplifier 1 goes high as a result. As amp 1 goes high, the input to the inverting pin of amp 2 also goes high, and the output of amp 2 goes low as a result. This immediately biases $D_1$ to a conducting state, and current flows from $C_2$ through $R_4$, causing $C_2$ to drain and its voltage to drop. $R_5$ also conducts, so the exact drain time $t_2$ is a function of both $R_5$ and $R_4$ working in parallel. As the voltage of $C_2$ drops below the 1.5 volt reference, amp 1 again goes low which causes amp 2 to again go high, starting the charge/drain cycle over again. $T_3$ becomes the time period that the output of amp 1 is low and $t_2$ the time period it is high. The two values can be manipulated by changing the value of R5 to affect the off time $t_3$ and changing $R_4$, and to a lesser extent $R_5$, to change the on period $t_2$. Since the on time is supposed to be shorter than the off period in this circuit, the value of $R_4$ is lower. The positive going pulse occurring during the on time $t_2$ is fed through $R_6$ into the base of $Q_2$ which turns $Q_2$ on. $Q_2$, in turn, allows large amounts of current to flow from 3 volts through $R_7$, through the anode of the LED $D_2$ and out its cathode, through the collector and emitter of $Q_2$ to ground. This flow of current turns $D_2$ on and causes it to emit light during the on interval $t_2$. $R_7$ acts to limit the total amount of current which can flow through $D_2$.

Thus, while $Q_1$ is on, amp 1 produces positive going pulses of time length $t_2$ and off periods $t_3$. These on/off times continue as long as $Q_1$ remains on supplying current to $U_1$. $T_3$ and $t_2$ can be altered to any desired lengths by changing the values of $R_4$ and $R_5$ as indicated. $T_2$ is the period the LED $D_2$ will be in the on state. The intensity of $D_2$ will be determined by $R_7$. The number of times in a second $D_2$ pulses is a function of both $t_3$ and $t_2$ values. All these variables can be manipulated to achieve a favorable combination of apparent brightness and overall current consumption.

When $Q_1$ goes off, it shuts $U_1$ off, the output of amp 1 remains low and $Q_2$ remains off, thus no current is drawn by the circuit until the $Q_1$ is again turned on.

Figure 3:
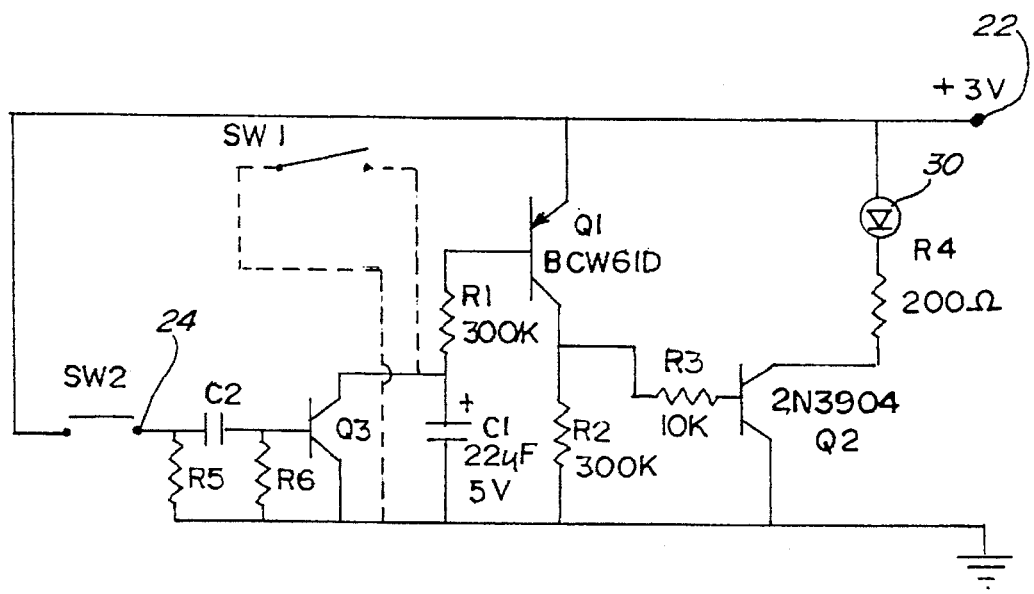
FIG. 3 is a circuit schematic of a novel, current-limiting circuit for the illumination element of the present invention, with two switch alternatives shown.

FIG. 3 is a circuit schematic for the current-limiting circuit 34. As can be seen, the circuit 34 includes a first transistor $Q_1$ connected to the battery 22. A first capacitor $C_1$ is connected to the first transistor $Q_1$. The first capacitor $C_1$ turns on the first transistor $Q_1$ when discharged and turns off the first transistor $Q_1$ when charged. The first capacitor $C_1$ is discharged by closing the switch 22. The first capacitor $C_1$ is recharged in a period $t_1$ by current flow through the first transistor $Q_1$.

A second transistor $Q_2$ is connected to the light-emitting diode 30 and the first transistor $Q_1$. The second transistor $Q_2$ is turned on by the first transistor $Q_1$. Current limiting resistor $R_4$ limits the current flowing through the circuit 34 in order to conserve battery 22 life.

In another embodiment, a third transistor $Q_3$ is connected to the switch 22 and first capacitor $C_1$.

Operation of the current-limiting circuit 34 is as follows.

Circuit Explanation for Current Limiting Circuit

First Embodiment:

Turning on the circuit:

Switch $Sw_1$ is a glass reed switch. Vibration applied to the reed switch, as when a basketball is bounced, causes the reeds to contact one another.

This in turn provides a temporary low impedance connection between the capacitor $C_1$ (22 uF capacitor) anode and ground. This cause the anode of $C_t$ to drain through $SW_1$ until it reaches ground or nearly ground potential.

Note that the reed switch could be replaced by any method whereby vibration causes a temporary low impedance connection between the capacitor anode and ground potential.

When the $C_1$ is drained in this manner, current flows from the emitter of $Q_1$ (the BCW61D pnp transistor) through the base, through the $R_1$ (the 300K resistor) which begins to recharge $C_1$. This current does two things. First, it turns on $Q_1$, causing current to flow from the emitter to the collector. This provides current at the collector which activates the rest of the circuit. Second, this current flow also begins to charge $C_1$ back up to the +3 volt level.

When the charge level reaches 3 volts, it will shut off $Q_1$. The time $t_1$ required for this to occur is a function primarily of $C_1$ and $R_1$ and can be varied by changing these two component values. Lowering either the capacitance of $C_1$ or reducing the resistance of $R_1$ will shorten the time interval before the $Q_1$ will shut off.

If the $Sw_1$ is activated before the shutoff time, then $C_1$ will again be discharged, keeping $Q_1$ on, which in turn will keep the remainder of the circuit turned on.

Turning on the LED:

When $Q_1$ is in the on state as described above, current flows from the emitter to the collector. This current in turn flows through $R_3$ (the 10K resistor) through the base of $Q_2$ (the 2N3904 npn transistor) through the emitter of the 2N3904 to ground.

This flow of current turns on $Q_2$. When $Q_2$ is turned on, there is a low impedance path from the collector of this transistor through the emitter to ground.

While $Q_2$ is on, current can flow through the anode of $D_1$ (the LED) through its cathode, through $R_4$ (the 200 ohm resistor) through the collector of $Q_2$ to the emitter and then to ground. This current flow through $D_1$ causes it to emit light. The amount of light is a function of current flow through the part. Higher current flow will increase brightness. Current flow can be controlled by varying of $R_4$, with increasing values of $R_4$ causing reductions in the flow of current and decreasing values of $R_4$ causing increases in the flow of current.

Turning off the LED:

When $Sw_1$ is not vibrated as described in the first section, then $C_1$ will eventually charge up, shutting off $Q_1$. This in turn will stop the flow of current from the emitter of $Q_1$ through the collector. $R_2$ will bring the voltage at $R_3$ to ground and current will cease to flow through the base of $Q_2$. This will shut of $Q_2$, causing the emitter and base to be in a high impedance non-conducting state, which in turn stops the flow of current through the $D_1$ causing it to shut off as well.

Current flowing through $R_1$, $R_2$ and $R_3$ does not contribute directly to emission of light from $D_1$. Current flow through these elements is used only to turn the circuit on. Hence, resistance values at these locations are chosen to be as high as possible to limit the amount of current required to activate the circuit since this is essentially waste current. $Q_1$ and $C_1$ values are chosen to work with intended high values of $R_1$.

Thus, with this circuit, overall current drain, when the circuit is on and the LED ($D_1$) is emitting light, is almost entirely a function current flow through $R_4$ with the remainder of the circuit drawing little current.

Shut off will be gradual as $C_1$ charges toward 3 volts. As the potential at $R_1$ nears 3 volts, $Q_1$ shuts off. The shutoff does not occur instantly, but slowly. Thus, current flow from emitter to collector is also slowly choked off. This in turn causes a slow turn off of $Q_2$. The net effect is a gradual dimming of $D_1$ as the circuit shuts down. Current flow when this circuit is in the off state is a function of leakage through $C_1$, $Q_1$ and $Q_2$. Leakage through $C_1$, if it is large, will cause partial turn on of $Q_1$. Hence, the component choices for $C_1$ should have low leakage.

Second Embodiment:

In this case, a switch is used where the switching element may keep the switch contacts shorted together for long periods of time. It is only the intermittent making and breaking of the switch during periods of vibration that trigger the LED drive circuit $Sw_2$, in conjunction, with $R_5$, creates voltage spikes between 3 volts and ground when the switch opens and closes. These voltage spikes are coupled across $C_2$ and positive going spikes turn on $Q_3$. When $Q_3$ is on, $C_1$ discharges through $Q_3$ which activates the circuit as described above. Note that when $Sw_2$ contacts are closed and resting, as may happen, current will flow through $R_5$. Thus, $R_5$ should be chosen to be as high a value as is practical. $C_2$ should likewise be as high a value as is practical to couple as much current to the base of $Q_3$ as possible. The RC network created by $R_5$ and $C_2$ eventually limits the practical size of both when the discharge time becomes so excessive that random bouncing is too rapid to allow voltage state of $C_2$ to change sufficiently.

The lighted, inflatable device 10 may be any sealed, inflatable device. In one embodiment, the device 10 is a standard-size, standard-weight basketball. The device 10 may also be any sports ball such as a volleyball, tetherball, football, soccer ball or playground ball of any size. The device 10 may alternatively be used in bicycle tires, inflatable pool toys, moon shoes, BounceBlasters, inflatable trampolines, inflatable slides, inflatable boats, inflatable swim vests, inflatable pools, and inflatable air mattresses.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. A lighted, inflatable device comprising:
   a permanently sealed outer shell,
   an inner inflatable bladder disposed within the outer shell, the bladder and shell each having a translucent portion,
   means for inflating the inner inflatable bladder, and
   an illumination element disposed between and securely held between the inner inflatable bladder and the outer shell
   whereby light from the illumination element passes through the translucent portions of the inner inflatable bladder and the outer shell.

2. The lighted, inflatable device of claim 1, wherein the illumination element further comprises a light, a battery, a switch, wiring, and a control element connected between the switch and the light, to control when the light is turned on.

3. The lighted, inflatable device of claim 2, wherein the light further comprises a plurality of light-emitting diodes.

4. The lighted, inflatable device of claim 2, wherein the switch is inaccessible from the exterior of the device.

5. The lighted, inflatable device of claim 2, wherein the switch is a vibration-sensitive switch.

6. The lighted, inflatable device of claim 3 wherein the control element is electronic.

7. The lighted, inflatable device of claim 6, wherein the control element further comprises a pulsing circuit to conserve battery life, the pulsing circuit turning on and off the light-emitting diode while the switch is on.

8. The lighted, inflatable device of claim 6, wherein the control element further comprises a resistance-based current limiting circuit to conserve battery life, the current limiting circuit turning on the light-emitting diode while the switch is on.

9. The lighted, inflatable device of claim 1, wherein the device is a standard-size, standard-weight basketball.

10. The lighted, inflatable device of claim 7, wherein the pulsing circuit comprises:
    a first transistor connected to the battery,
    a first capacitor connected to the first transistor, the first capacitor turning on the first transistor when discharged and turning off the first transistor when charged, the first capacitor being discharged by closing the switch and being recharged in a period $t_1$ by current flow through the first transistor,
    a two-stage operational amplifier whose inverting input is connected to the first transistor, the output voltage of whose second stage is the opposite of the output voltage of whose first stage,
    a second transistor connected to the output of the first stage of the operational amplifier, to ground, and to the light-emitting diode,
    an RC circuit connected between the output of the second stage of the operational amplifier and the non-inverting input of the first stage of the operational amplifier, and associated resistors
    to pulse the light emitting diode on for a time period $t_2$ and off for a time period $t_3$, the values of $t_1$, $t_2$, and $t_3$ being determined by the values of the resistors and capacitors.

11. The lighted, inflatable device of claim 8, wherein the current-limiting circuit further comprises:

a first transistor connected to the battery, a first capacitor connected to the first transistor, the first capacitor turning on the first transistor when discharged and turning off the first transistor when charged, the first capacitor being discharged by closing the switch and being recharged by current flow through the first transistor, a second transistor connected to the light-emitting diode and the first transistor, the second transistor being turned on by the first transistor, and current-limiting resistors.

12. The lighted, inflatable device of claim 11, further comprising a third transistor connected to the switch and the first capacitor.

13. A permanently sealed, lighted, inflatable device having a self-contained, non-replaceable illumination element, the device comprising:

a permanently sealed outer shell, an inner inflatable bladder disposed within the outer shell, the bladder and shell each having a translucent portion, means for inflating the inner inflatable bladder, and a self-contained, non-replaceable illumination element disposed between and engagingly held in place by the inner inflatable bladder and the outer shell, the illumination element further comprising a light, a non-accessible switch, a battery and an electronic control element for conserving battery life, whereby light from the illumination element passes through the translucent portions of the inner inflatable bladder and the outer shell.

14. The lighted, inflatable device of claim 13, wherein the light further comprises a plurality of light-emitting diodes.

15. The lighted, inflatable device of claim 13, wherein the switch is a vibration-sensitive switch.

16. The lighted, inflatable device of claim 14, wherein the control element further comprises a pulsing circuit to conserve battery life.

17. The lighted, inflatable device of claim 14, wherein the control element further comprises a resistance-based current limiting circuit to conserve battery life.

18. The lighted, inflatable device of claim 13, wherein the device is a standard-size, standard-weight basketball.

19. The lighted, inflatable device of claim 13, wherein the battery is rechargeable and further comprising a battery charger.

20. The lighted, inflatable device of claim 16, wherein the pulsing circuit comprises:

a first transistor connected to the battery, a first capacitor connected to the first transistor, the first capacitor turning on the first transistor when discharged and turning off the first transistor when charged, the first capacitor being discharged by closing the switch and being recharged in a period $t_1$ by current flow through the first transistor, a two-stage operational amplifier whose inverting input is connected to the first transistor, the output voltage of whose second stage is the opposite of the output voltage of whose first stage, a second transistor connected to the output of the first stage of the operational amplifier, to ground, and to the light-emitting diode, an RC circuit connected between the output of the second stage of the operational amplifier and the non-inverting input of the first stage of the operational amplifier, and associated resistors to pulse the light emitting diode on for a time period $t_2$ and off for a time period $t_3$, the values of $t_1$, $t_2$, and $t_3$ being determined by the values of the resistors and capacitors.

21. The lighted, inflatable device of claim 17, wherein the current-limiting circuit further comprises:

a first transistor connected to the battery, a first capacitor connected to the first transistor, the first capacitor turning on the first transistor when discharged and turning off the first transistor when charged, the first capacitor being discharged by closing the switch and being recharged by current flow through the first transistor, a second transistor connected to the light-emitting diode and the first transistor, the second transistor being turned on by the first transistor, and current-limiting resistors.

22. The lighted, inflatable device of claim 21, further comprising a third transistor connected to the switch and the first capacitor.

23. A permanently sealed, lighted, inflatable ball having a self-contained, non-replaceable illumination element, the ball comprising:

a permanently sealed outer shell, an inner inflatable bladder disposed within the outer shell, the bladder and shell each having a translucent portion, a valve for inflating the inner inflatable bladder, and a self-contained, non-replaceable illumination element disposed between and engagingly held in place by the inner inflatable bladder and the outer shell, the illumination element further comprising a light-emitting diode, a vibration-sensitive switch, a battery and an electronic control element for conserving battery life, whereby light from the illumination element passes through the translucent portions of the inner inflatable bladder and the outer shell.

24. The lighted, inflatable ball of claim 23, wherein the control element further comprises a pulsing circuit to conserve battery life.

25. The lighted, inflatable ball of claim 23, wherein the control element further comprises a resistance-based current limiting circuit to conserve battery life.

26. The lighted, inflatable ball of claim 23, wherein the ball is a standard-size, standard-weight basketball.

27. The lighted, inflatable ball of claim 24, wherein the pulsing circuit comprises:

a first transistor whose emitter is connected to the battery's positive terminal, a first capacitor connected to the base of the first transistor, a two-stage operational amplifier, a second transistor whose base is connected to the output of the first stage of the operational amplifier and whose collector is connected to ground and whose emitter is connected to the light-emitting diode, an RC circuit connected between the output of the second stage of the operational amplifier and the non-inverting input of the first stage of the operational amplifier, the collector of the first transistor being connected to the inverting input of the first stage of the operational amplifier, and associated resistors such that closing of the switch causes the first capacitor to discharge through a resistor, turning on the first transistor; turning on the first transistor causes a reference voltage to be applied to the inverting input of the first stage of the operational amplifier and causes the first capacitor to be recharged in a time period $t_1$; the reference voltage causes the output of the first stage of the operational amplifier to go low if the reference voltage is greater than the voltage applied to the non-inverting input of the first stage of the operational amplifier; the output of the first stage of the operational amplifier going low turns off the second transistor and causes the output of the second stage of the operational amplifier to go high; turning off the second transistor causes the light-emitting diode to stop conducting; and the output of the second stage of the operational amplifier is fed back through the RC circuit to the non-inverting input of the first stage of the operational amplifier to pulse the light emitting diode on for a time period $t_2$ and off for a time period $t_3$, the values of $t_1$, $t_2$, and $t_3$ being determined by the values of various resistors and capacitors.

28. The lighted, inflatable ball of claim 25, wherein the current-limiting circuit further comprises:

a first transistor connected to the battery, a first capacitor connected to the first transistor, the first capacitor turning on the first transistor when discharged and turning off the first transistor when charged, the first capacitor being discharged by closing the switch and being recharged by current flow through the first transistor, a second transistor connected to the light-emitting diode and the first transistor, the second transistor being turned on by the first transistor, and current-limiting resistors.

29. The lighted, inflatable ball of claim 28, further comprising a third transistor connected to the switch and the first capacitor.

* * * * *